METHOD OF VAPOR GROWTH OF A SEMICONDUCTOR CRYSTAL

Filed Oct. 20, 1969 7 Sheets-Sheet 1

INVENTORS
YASUSHI KOGA, HIROTSUGU KOZUKA and
SHOJI TAUCHI
BY
Craig, Antonelli, Stewart & Hill
ATTORNEYS INVENTORS
YASUSHI KOGA, HIROTSUGU KOZUKA and
SHOJI TAUCHI
BY
Craig, Antonelli, Stewart & Hill
ATTORNEYS

INVENTORS

YASUSHI KOGA, HIROTSUGU KOZUKA and SHOJI TAUCHI

BY

Craig, Antonelli, Stewart & Hill

ATTORNEYS

INVENTORS
YASUSHI KOGA, HIROTSUGU KOZUKA and
SHOJI TAUCHI
BY
Craig, Antonelli, Stewart & Hill
ATTORNEYS INVENTORS
YASUSHI KOGA, HIROTSUGU KOZUKA and
SHOJI TAUCHI

INVENTORS

YASUSHI KOGA, HIROTSUGU KOZUKA and

SHOJI TAUCHI

BY Craig, Antonelli, Stewart & Hill

ATTORNEYS

INVENTORS

YASUSHI KOGA, HIROTSUGU KOZUKA and SHOJI TAUCHI

BY

Craig, Antonelli, Stewart & Hill

ATTORNEYS 3,682,699

METHOD OF VAPOR GROWTH OF A SEMICONDUCTOR CRYSTAL

Yasushi Koga and Hirotsugu Kozuka, Tokyo, and Shoji Tauchi, Hino-shi, Japan, assignors to Hitachi, Ltd., Tokyo, Japan Filed Oct. 20, 1969, Ser. No. 867,651
Claims priority, application Japan, Oct. 25, 1968, 43/77,378
Int. Cl. B01j *17/28*
U.S. Cl. 117—201 3 Claims

ABSTRACT OF THE DISCLOSURE

A method of vapor growth of a semiconductor crystal by allowing a reaction gas to flow in parallel to one principal surface of a semiconductor wafer disposed in a reaction tube under reduced pressure, thereby depositing a semiconductor crystal layer uniformly on the principal surface of said semiconductor wafer.

Figure 1:
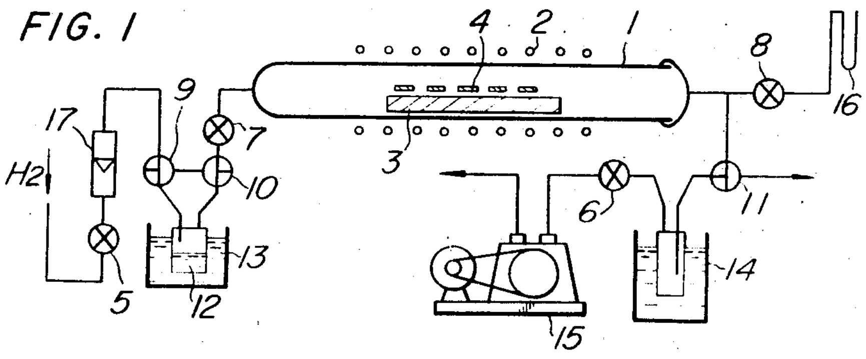

This invention relates to a method of vapor growth of a semiconductor crystal, and more particularly to an improvement on the method for forming an epitaxial crystal layer uniformly on a semiconductor wafer.

It is well known today that the epitaxial crystal is often used in the semiconductor industry and that the crystal in most cases is obtained by the vapor growth method.

Although the epitaxial crystal can be manufactured by the liquid phase growth and the vapor phase-liquid phase growth, the control of the crystal characteristics and of the thickness of the growth layer can be done most accurately by the way of deposition from vapor phase. Due to the high working efficiency the vapor growth method is employed for the mass production of silicon which is in great demand today.

According to this vapor growth method, usually a semiconductor wafer is disposed on a graphite jig and heated at about 1200° C. Then a desired reaction gas is thermally decomposed and/or reduced, thereby depositing a semiconductor crystal layer on the semiconductor wafer.

However, it is difficult to control the flow of the reaction gas in order that it may act uniformly on the semiconductor wafer. No accurate formation of a crystal layer with a uniform thickness on the whole wafer is satisfactorily performed.

When a crystal layer is to be formed on a large number of semiconductor wafers in a single step in order to promote the efficiency of the crystal growth treatment, it is very difficult to form a crystal layer having a uniform thickness on each and every wafer.

With the increase in demand and development of large scale integrated circuit devices and high power elements it has been practiced to make the area of the semiconductor wafer big enough to obtain a large number of semiconductor elements or large-area semiconductor elements from a single wafer. The difficulty of obtaining a crystal layer having a uniform thickness over the whole surface of a semiconductor wafer has made the above problem more and more important.

The reasons for this difficulty are considered to be due to the facts (1) that the reaction gas cannot be brought into uniform contact with the wafer, and (2) that with the lateral flow of the reaction gas the composition of the gas varies.

The first reason depends upon the shape of the reaction tube and the jig while the second one is unavoidable when the reaction gas is moved along the wafer surface.

According to the most usually employed form, a slender jig on which a plurality of wafers are disposed in a row is inserted into an elongated and circular quartz reaction tube. The reaction gas is allowed to flow through the tube from one end to the other. Whereas this method is advantageous in its simpleness in that the jig fitted with a wafer need only be inserted into the tube, the thickness of the crystal growth layer is liable to become non-uniform, particularly depending on the longitudinal direction of the reaction tube, namely the direction of the gas flow.

For this reason, it is difficult to obtain a great number of wafers having uniform epitaxial layers at one time. In other words, the number of wafers which can be treated in one epitaxial growth step is restricted to a few or ten sheets. Much equipment and personnel are required to meet the large demands of production.

On the other hand, a method of using a barrel type apparatus is proposed. According to this method, a large number of wafers are fitted in many rows on the outer side face of a cylindrical jig (barrel) and inserted into a reaction tube. The jig is revolved in the tube while the reaction gas is allowed to flow from one end of the jig to the other. Since in this method the wafers are moved across the direction of the reaction gas flow by the revolution of the barrel, the influence of the convection of the reaction gas is smaller than in the previous method where the wafer is in the stationary state. Therefore, the whole surface of wafer is well in contact with the reaction gas so that the growth layer is formed on the surface substantially uniformly. However, in this method too, it is impossible to correct any non-uniformity appearing along the flow of the reaction gas.

This invention is made to overcome the abovementioned defects of the prior art methods and provide an effective method.

Therefore, the object of this invention is to form a semiconductor crystal layer having a uniform thickness epitaxially grown on the semiconductor substrate along the direction of the reaction gas flow.

Another object of this invention is to form a semiconductor crystal layer having a uniform thickness on the semiconductor substrate along the direction intersecting the direction of the reaction gas flow.

A further object of this invention is to provide a method of mass production for forming semiconductor crystal layers having a uniform thickness on the semiconductor substrates.

In one preferred embodiment of this invention it is proposed to permit a reaction gas, containing e.g. silicon halides, to flow in parallel to and along the principal surface of a semiconductor substrate at a pressure lower than atmospheric pressure in order to uniformly grow a semiconductor crystal on the principal surface.

Other features and effects of this invention will be understood from the following detailed description of the preferred embodiments taken in conjunction with the accompanying drawings, in which:

FIG. 1 shows a rough constitutional diagram of a crystal manufacturing apparatus.

Figure 2A:
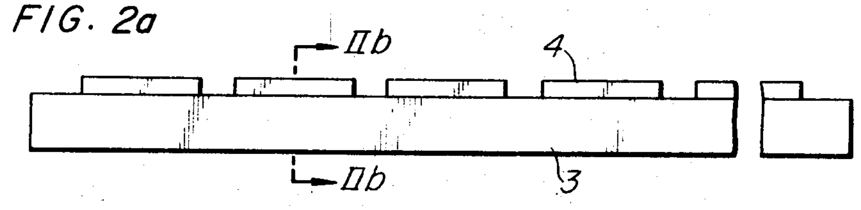
Figure 2B:
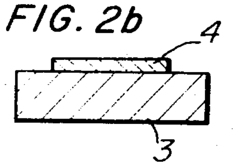

FIGS. 2*a* and 2*b* are side and sectional views of a jig for heating the semiconductor substrate respectively.

Figure 3A:
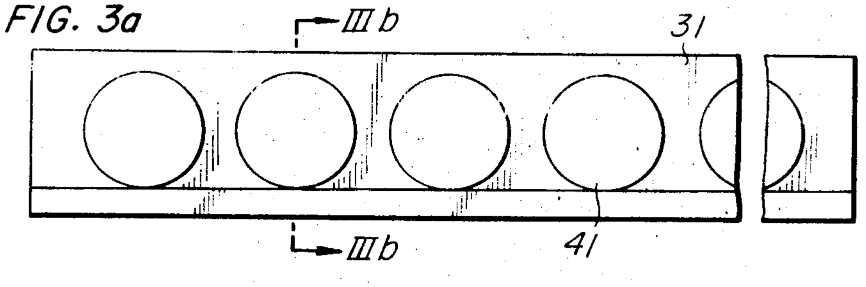
Figure 3B:
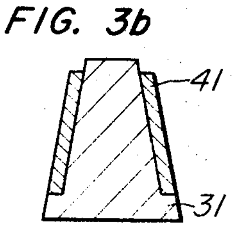

FIGS. 3*a* and 3*b* are side and sectional views of another jig for heating the semiconductor substrate respectively.

FIGS. 4, 5, 6*a*, 7, 8 and 9 show the characteristic diagrams demonstrating the experimental results of the embodiments of this invention.

Figures 6A, 6B:
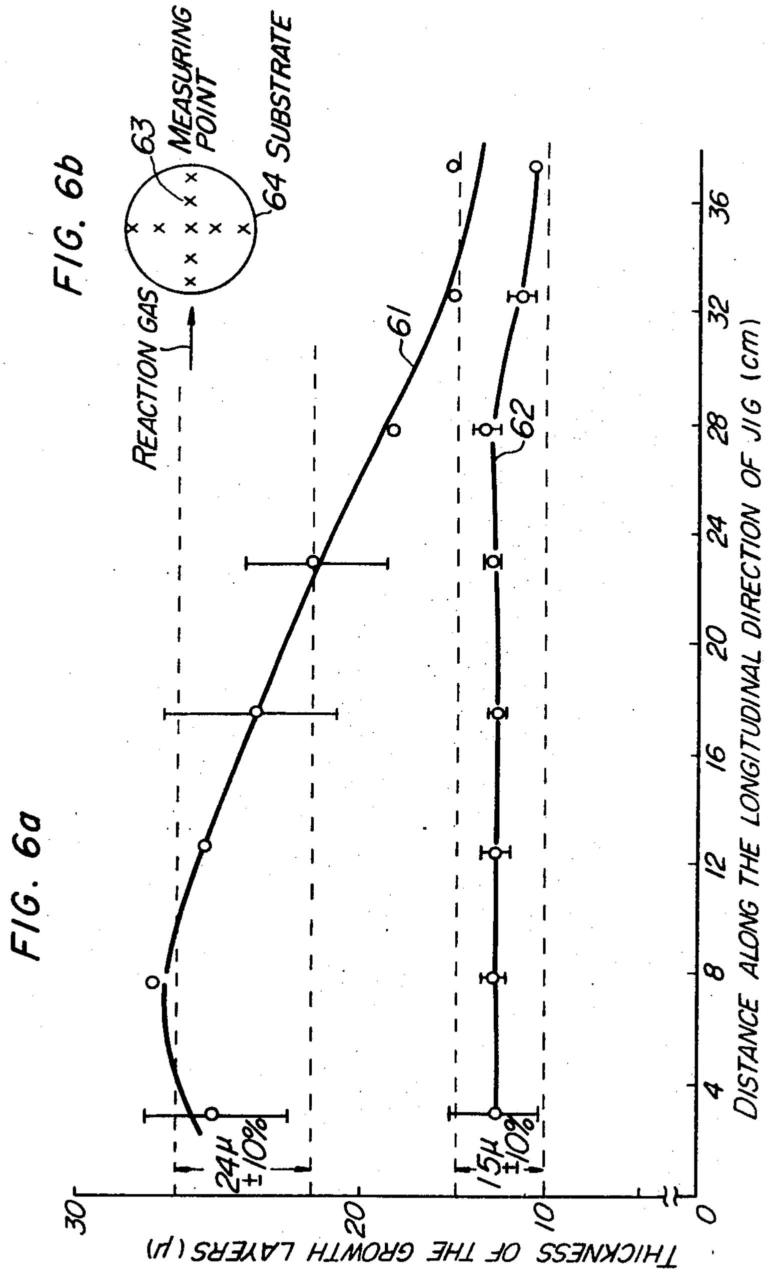

FIG. 6*b* shows the measuring points on an epitaxial wafer to obtain the data shown in FIG. 6*a*.

In FIG. 1 showing a rough explanatory view of a crystal manufacturing apparatus according to an embodiment of this invention, 1 is a quartz reaction tube having an inner diameter of 70 mm., 2 is a high frequency induction heating coil, 3 is a carbon jig or supporter having a depth of 15 mm., a width of 60 mm. and a length of 440 mm., 4 is a semiconductor substrate (wafer), 5 is a pressure regulating valve, 6 is an exhaustion regulating valve, 7 is a flow regulating valve, 8 is a valve for operating the mercury manometer 16, 9, 10, and 11 are direction modification valves, 12 is silicon tetrachloride, 13 is ice, 14 is liquid nitrogen, 15 is a vacuum pump, and 17 is a hydrogen flowmeter.

A large number of semiconductor substrates 4 are arranged in a row along the direction of the reaction gas flow, as shown enlarged in FIGS. 2*a* and 2*b*. FIG. 2*a* is a side view while FIG. 2*b* is a sectional view along the line II*b*—II*b*. Another jig as shown in FIGS. 3*a* and 3*b* can be advantageously utilized for mass production of wafers. This jig has a height of 62 mm. and a width of 30 mm. The semiconductor substrates 4 are inserted into the quartz reaction tube 1 together with the jig 3 and heated by means of a high frequency heating coil 2 indirectly through the jig 3.

Firstly, hydrogen is allowed to flow into the reaction tube. The vacuum pump 15 operates to decrease the pressure in the reaction tube 1. Next, a gaseous mixture of hydrogen and silicon tetrachloride (if necessary a suitable dopant may be admixed) is introduced.

In more detail, the hydrogen pressure is adjusted from e.g., 1.5 atm. to about 1 atm. by means of the pressure regulating valve (depressor valve) 5, effecting an accurate regulation of the quantity of flow by the flow regulating valve 7. The pressure of the hydrogen varies the flow rate. Therefore, it is desirable to fix the hydrogen pressure at a constant value. The mixture of carrier gas (hydrogen) and silicon tetrachloride gas whose flow rate is determined by the flow regulating valve 7 is introduced into the reaction tube 1 and by way of the liquid nitrogen trap 14 it is exhausted by the vacuum pump 15. The exhaustion rate is adjusted by the exhaustion regulating valve 6, whereby the pressure in the reaction tube 11 is controlled. Denoting the incident pressure determined by the regulating valve 5 by $P_{in}$, the hydrogen flow rate controlled by the valve 7 and indicated by the indicator 17 by $F_{in}$ and the exhaustion rate of the gas in the tube controlled by the exhaust valve 6 by $F_{out}$, the pressure P in the reaction tube is indicated by the manometer 16 as follows:

$$P=(F_{in}/F_{out})\cdot P_{in}$$

For example, for $P_{in}=760$ mm. Hg, $F_{in}=20$ l./min, and $F_{out}=70$ l./min., $P\cong 220$ mm. Hg.

The semiconductor substrate 4 is heated up to about 1200° C. The composition of the gas introduced into the reaction tube is set; silicon tetrachloride:hydrogen=1:100 (mol ratio). The characteristics of the crystal growth on the substrate 4 with respect to the variation of pressure in the reaction tube are measured.

Figure 4:
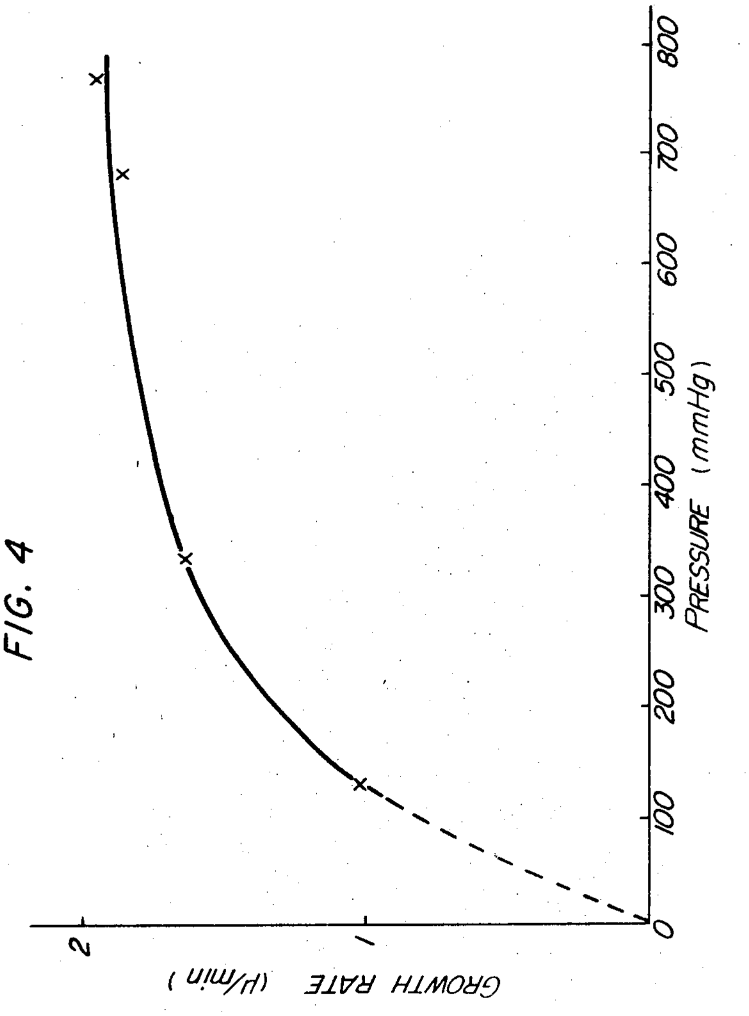

In FIG. 4 showing the relation between the growth rate and the pressure variation in the tube, it is seen that the growth rate decreases with the reduction of pressure i.e., the growth rate is nearly proportional to the cubic root of the pressure.

Figure 5:
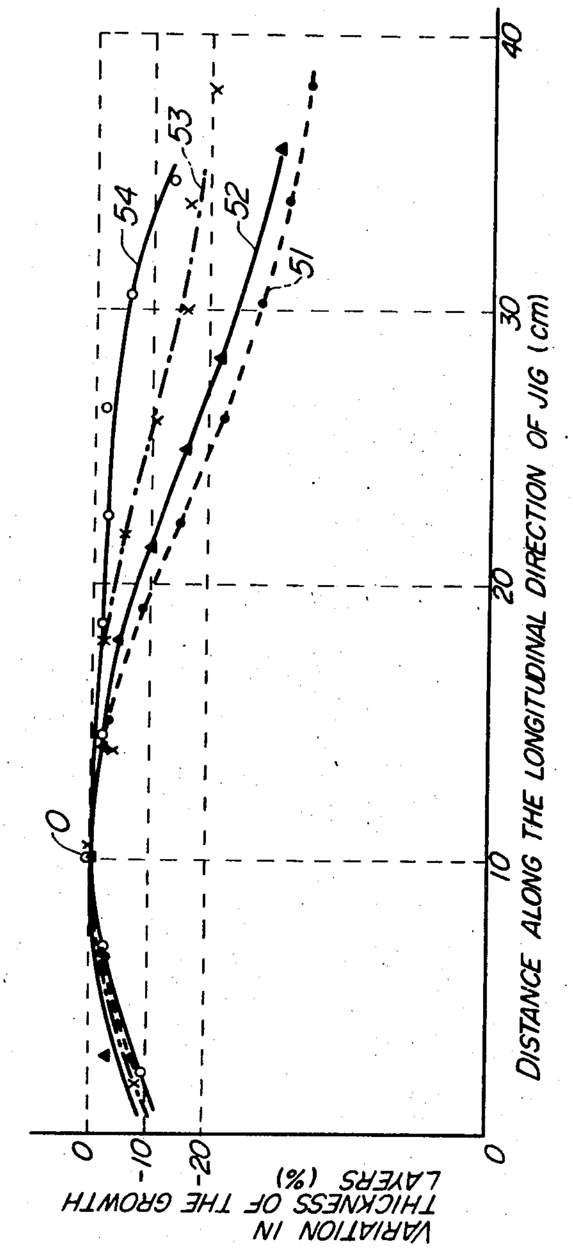

FIG. 5 shows the curve of the percent variation in the thickness of the crystal growth layer on some wafers disposed along the direction of reaction gas flow when a large number of semiconductor substrates 4 are arranged in a row at intervals of 4 cm. on the jig 3 and the reaction gas is introduced along the direction of the arrangement. In this figure, curves 51, 52, 53 and 54 correspond to the pressures 760 mm. Hg, 680 mm. Hg, 330 mm. Hg and 130 mm. Hg respectively. At about 10 cm. from one end of the jig near the gas inlet the thickness of the growth layer on each wafer is substantially uniform, independently of the pressure. The variation in thickness is expressed by percentage with a value of 10 cm. set as standard. It is seen that with a decrease in pressure the variation in thickness of the growth layer also decreases, particularly at less than 330 mm. Hg the variation is limited within −20%.

FIG. 6a shows the distribution of the thickness of the growth layer on plural wafers arranged along the direction of the reaction gas flow, and the variation of thicknesses measured at several points the principal surface of the substrates.

The substrates 4 are arranged in a row at intervals of 5 cm. on the jig 3 and the reaction gas is allowed to flow in the direction of the arrangement. The reaction conditions (heating temperature and gas composition) are the same as those in the afore-mentioned case. The reaction time is 15 minutes. In FIG. 6*a*, curves 61 and 62 correspond to the pressures 760 mm. Hg and 133 mm. Hg respectively. The variation in thickness of the growth layer is measured at 9 points 63 in the principal surface of semiconductor substrate 64.

From FIG. 6*b* it is apparent that the variation in thickness of the growth layer can be decreased with the decrease of pressure in the reaction tube, not only in the direction along the gas flow, but also in the direction across it.

Figure 7:
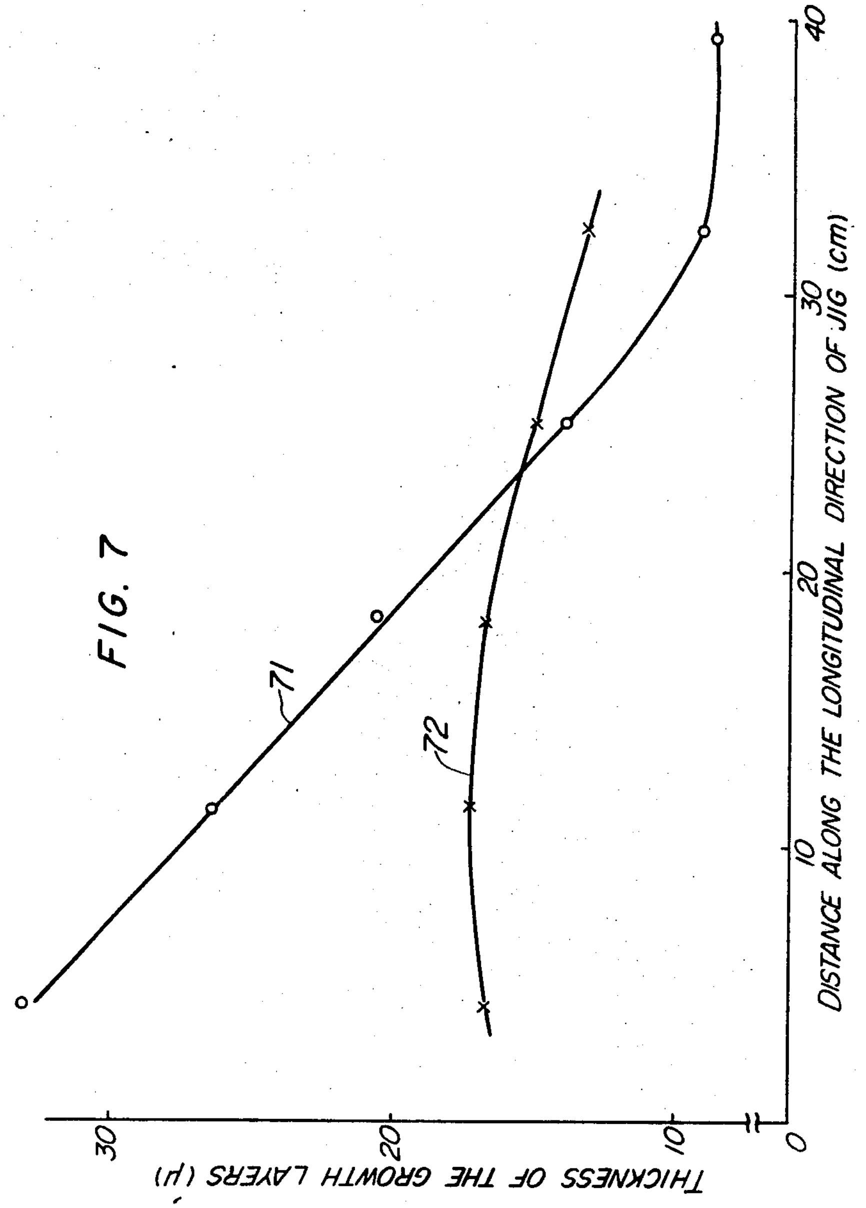

FIG. 7 shows the characteristic curves when the jigs as shown in FIGS. 3*a* and 3*b* are used.

In this figure, curves 71 and 72 correspond to the pressures 760 mm. Hg and 121 mm. Hg respectively. The reaction conditions (heating temperature and gas composition) are the same as those in the above case. The reaction time is 10 minutes.

From FIG. 7, it can be understood that when the pressure in the reaction tube is not reduced the thickness of the growth layer on the wafers arranged along the direction of the reaction gas flow has a large variation, but that the variation can be largely improved by low pressure treatment.

The reason for the large variation at higher pressure as indicated by the curve 72 is considered to be due to the fact that the space in the reaction tube, and hence the reaction gas, is divided into two parts by the jig 31, so that the plural semiconductor substrates contact the divided gas, thereby making the consumption of reaction gas considerable, and due to the fact that the quartz tube adjacent to the jig 31 is heated also to a high temperature so that the semiconductor is deposited on the inner wall of the reaction tube consuming the reaction gas.

Figure 8:
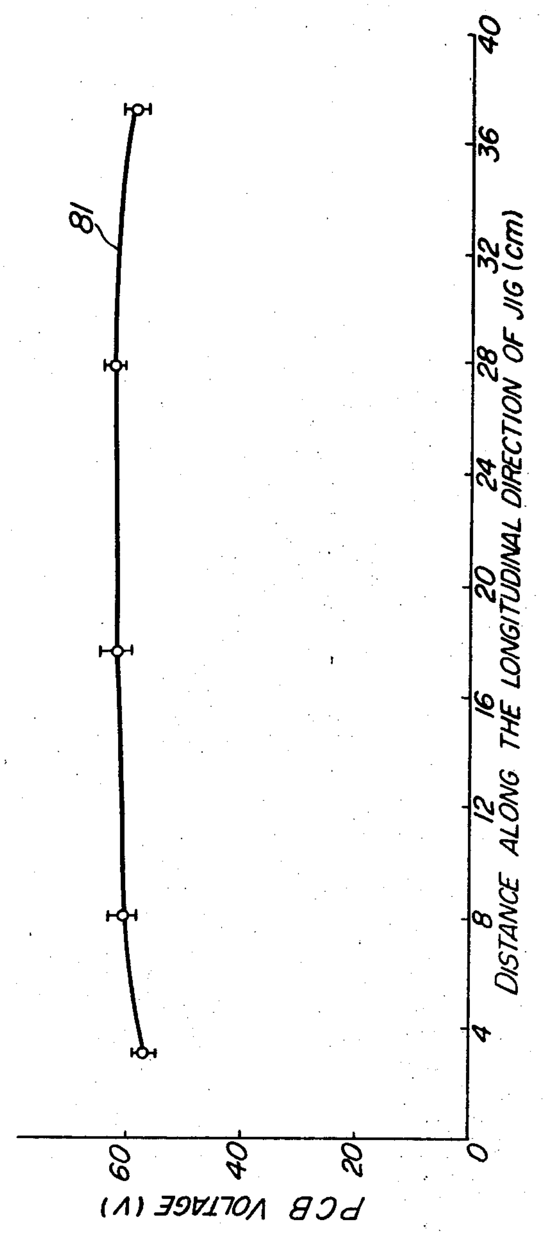

FIG. 8 shows the distribution of PCB voltages (point contact breakdown voltage) of the growth crystal layers on plural wafers arranged along the direction of reaction gas flow and its variation on several points on the principal surface of the wafer. The growth layer is obtained at 130 mm. Hg and measurements are done by the PCB method well-known in the art. Since the logarithmic value of PCB voltage and the logarithm of resistivity of the growth layer are in proportion, it may be concluded from the above results that the resistivity of the growth layer has only a small variation.

Figure 9:
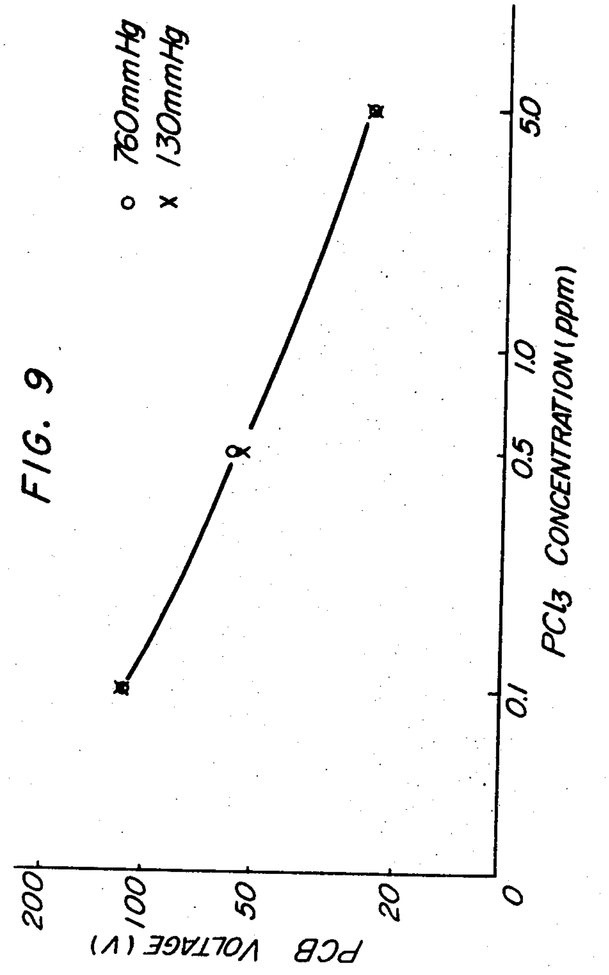

FIG. 9 shows the relationship between the pressure in the reaction tube and the concentration of the impurity for determining the conductivity type, i.e., concentration ([$PCl_3$] vapor/[$SiCl_4$] vapor). As apparent from the figure, even with the variation in pressure if the supplied impurity concentration is constant, the growth crystal layer has the same resistivity.

As is evident from the above description according to the present invention, it is possible to form a epitaxial layer having a uniform thickness both in the directions along and across the flow of the reaction gas by carrying out the crystal growth at a reduced pressure.

Since the reaction gas which is introduced into the reaction tube under a reduced pressure state is expanded, the quantity of gas which must be supplied can be made small. The gas is exhausted by the vacuum pump and passes rapidly through the reaction tube so that the gas cannot be extremely consumed only in the wafers near the gas inlet. As a result, a good distribution of thickness and resistivity can be obtained.

These favorable results are obtained when the pressure in the reaction tube is decreased below atmospheric pressure. The effect is largest at less than 350 mm. Hg, and particularly when under 200 mm. Hg, as shown in FIG. 5.

In view of the growth rate shown in FIG. 4 it is desirable to keep the pressure above 100 mm. Hg. Under 100 mm. Hg due to the high frequency alternating electric field of the high frequency coil a discharge phenomenon appears, causing a danger of distributing the reaction tube.

With different shapes of jigs and reaction tubes the present invention achieves a unique effect. Although the above description discusses only the horizontal type, it is needless to say that the invention is also applicable to the barrel type.

It is to be noted that with the use of the jigs as shown in FIGS. 3*a* and 3*b* the application of the present invention is particularly effective as shown in FIG. 7.

Although the above description described only a case when a single crystal is epitaxially grown on a silicon substrate, the present invention can be applied to other cases when a polycrystal is grown and when other semiconductor materials, e.g. germanium, are grown. Also the proposed method is applicable to the so-called heteroepitaxy. The reaction gas may be monosilane or trichlorosilane, etc.

What is claimed is:

1. In a method for growing monocrystalline silicon layers on major surfaces of silicon substrates positioned in a deposition zone by heating said substrates, by rapidly flowing a reaction gas containing silicon halides along and past said major surfaces of said substrates and by exhausting said reaction gas from said deposition zone, the improvement which comprises arranging said substrates in a line along the direction of said reaction gas and growing said monocrystalline silicon layer at a pressure of about 100 to 350 mm./Hg.

2. The improvement of claim 1 wherein said substrates are heated by a high frequency coil.

3. The improvement of claim 1 wherein said pressure is less than about 200 mm. Hg.

References Cited

UNITED STATES PATENTS

| | | | |
|---|---|---|---|
| 3,047,438 | 7/1962 | Marinace | 117—106 A |
| 3,211,583 | 10/1965 | Riley | 117—106 A |
| 3,325,392 | 6/1967 | Rummel | 117—201 X |
| 3,473,959 | 10/1969 | Ehinger et al. | 117—201 |
| 3,484,311 | 12/1969 | Benzing | 117—106 A |
| 3,493,444 | 2/1970 | Sirth et al. | 117—106 A |

RALPH S. KENDALL, Primary Examiner

U.S. Cl. X.R.

117—106 A